United States Patent [19]

Wagner

[11] 4,286,051
[45] Aug. 25, 1981

[54] METHODS OF ENGRAVING WORKPIECE SURFACES BY ETCHING

[76] Inventor: Ulrich Wagner, Röntgenstr. 2, D 7110 Öhringen, Fed. Rep. of Germany

[21] Appl. No.: 96,016

[22] Filed: Nov. 20, 1979

[30] Foreign Application Priority Data

Nov. 25, 1978 [DE] Fed. Rep. of Germany ....... 2851101

[51] Int. Cl.³ .............................................. G03C 5/00
[52] U.S. Cl. ................... 430/323; 156/659.1; 430/5; 430/325; 430/327; 430/396
[58] Field of Search .................. 430/5, 323, 327, 325, 430/396; 156/659

[56] References Cited

U.S. PATENT DOCUMENTS

| 2,265,974 | 12/1941 | Heinecke | 430/5 X |
|---|---|---|---|
| 2,939,787 | 6/1960 | Giaimo | 430/5 X |
| 3,284,197 | 11/1966 | Smith et al. | 430/5 |
| 3,513,010 | 5/1970 | Notley | 430/5 X |
| 3,561,337 | 2/1971 | Mulkey | 430/302 X |
| 3,592,649 | 7/1971 | Parsonage et al. | 430/5 |
| 4,002,478 | 1/1977 | Kokawa et al. | 430/325 X |
| 4,168,978 | 9/1979 | Koenig | 430/569 |

*Primary Examiner*—Edward O. Kimlin
*Attorney, Agent, or Firm*—Shenier & O'Connor

[57] ABSTRACT

There is provided a method of engraving a workpiece surface 14 by etching using a thin flexible support foil 18 which carries a dissolvable pattern 20 made of a dye opaque to light. The support foil 18 with the pattern bearing side is deposited on the workpiece surface 14 and the pattern 20 transferred to the workpiece 12, after which the support foil 18 is removed and the surface 14 treated with an etching agent. Prior to the deposition of the pattern 20, a photographic lacquer layer 16 is applied to the surface 14. The lacquer layer 16 is then exposed to light through the pattern 20, after which the exposed or unexposed regions of the lacquer layer 16 are removed and the regions not covered by the lacquer layer 16 are then subjected to etching.

3 Claims, 3 Drawing Figures

METHODS OF ENGRAVING WORKPIECE SURFACES BY ETCHING

The invention relates to a method of engraving an arbitrarily curved or plane surface of a workpiece by etching using a thin, flexible support foil which carries a dissolvable pattern made of an opaque dye, in which the support foil with its side carrying the pattern is deposited on the surface of the workpiece and the pattern is transferred to the workpiece, after which the support foil is removed and the workpiece surface is treated with an etching agent.

A method of this kind is already known, in which the resistance of certain dyes to the etching agent is exploited. The pattern consisting of such a dye then forms on the surface of the workpiece an etching mask, so that those regions of the workpiece surface which are not covered by the pattern are exposed to the etching agent and are thus engraved. Support foils printed with the most diverse patterns and which can be manipulated in the manner of transfer pictures are commercially available. However, in practice it has been found that the engravings produced with this known method are not wholly satisfactory.

According to the invention, there is provided a method of engraving an arbitrarily curved or plane surface of a workpiece by etching, comprising applying a photographic lacquer layer to the surface of the workpiece to be etched, depositing on the photographic lacquer layer a thin flexible support foil which carries a dissolvable pattern made of a dye opaque to light with the pattern bearing side of the foil on the photographic lacquer layer, transferring the pattern to the photographic lacquer layer, removing the support foil, exposing the photographic lacquer layer to light through the pattern, removing the exposed or unexposed regions of the photographic lacquer layer, and treating the surface of the workpiece with an etching agent so that the regions not covered by the lacquer layer on the workpiece are subjected to etching.

It is possible to provide an etching engraving process which is simple to execute and by means of which engravings of high quality can be produced. This can be achieved by using a pattern transferable with the support foil in the manner of a transfer picture merely as exposure mask for a photographic lacquer layer, which then serves as an etching mask for the workpiece-surface to be engraved. There are available both photographic lacquers so called photoresists with which after exposure the exposed regions can be easily washed out, as well as photographic lacquers with which the unexposed regions are subsequently dissolved and removed, whilst the exposed regions form the mask.

With the aid of photographic lacquer layers excellent etching masks can be produced, so that the preconditions for producing high-quality engravings by etching are satisfied.

In the commercially available support foils printed with patterns, which can be utilized in the manner of transfer pictures, the side facing away from the support foil of the printed pattern has an adhesive layer, owing to which the dyed pattern adheres perfectly to the workpiece surface when after drying-out of the adhesive the support foil is stripped off as a whole; however, it would also be possible to use support foils which dissolve in specific solvents, so that only the dyed pattern remains on the photographic lacquer layer of the workpiece.

The only requirement to be imposed on the dye forming the pattern is that it must be opaque to the light to which the photographic lacquer layer is exposed and, in contast to the known process described at the outset, it is not necessary for the dye to be resistant to the etching agent.

Preferably, there is provided between the support foil and the photographic lacquer layer a soluble adhesive layer for fixing the pattern on the photographic lacquer layer. This layer of adhesive may be located on the support foil itself and to cover the dyed pattern. The requirement, for instance, for a water-soluble adhesive arises because after exposure of the photographic lacquer layer the adhesive must be just as removable as the exposed or unexposed regions of the photographic lacquer layer.

The dye constituting the pattern transferred to the workpiece could, in principle, remain on those regions of the photographic lacquer which have not been removed after exposure; however, it is more advantageous to remove the pattern after the exposure, preferably by means of a solvent of the dye constituting the pattern.

Such methods are not limited to metallic workpieces, but can be applied to all etchable materials, e.g. also to glass and stone.

When an adhesive is used for fixing the pattern on the photographic lacquer layer, the adhesive must be transparent to the light to which the photographic lacquer layer is exposed.

Although the use of photographic lacquer layers as etching masks in the manufacture of engraved workpiece surfaces is known (see e.g. German patent specification No. 22 45 288 of the Applicant), the production of the masks for the exposure of the photographic lacquer layers was hitherto substantially more complicated and costlier than in the case of the present method.

The invention will be further described, by way of example, with reference to the accompanying drawings, in which.

Figure 1:
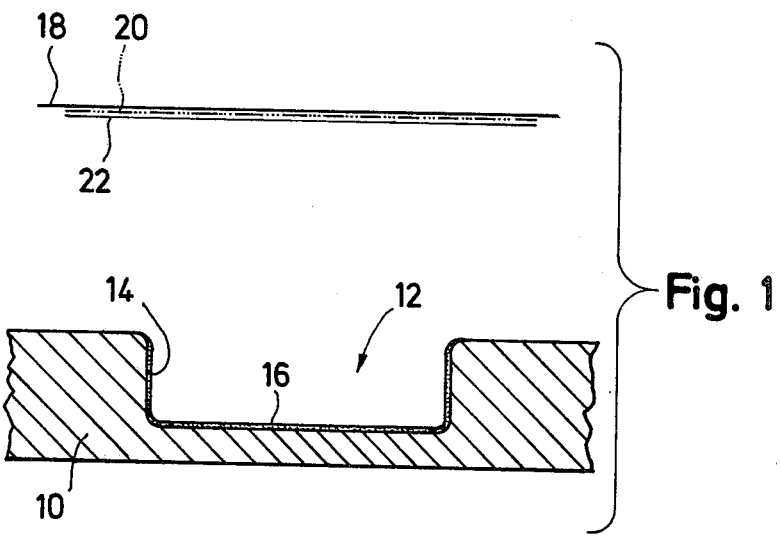
FIG. 1 shows a schematical sectional view through a workpiece and a support foil prior to its deposition on the workpiece.
Figure 2:
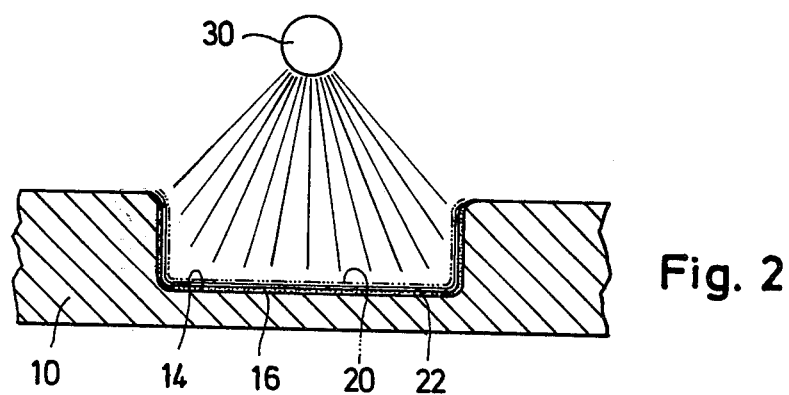
FIG. 2 shows the workpiece during the exposure of the photographic lacquer layer.
Figure 3:
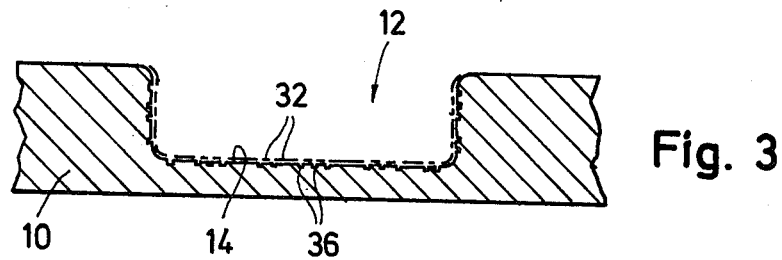
FIG. 3 shows the workpiece after etching, but with the etching mask formed by the photographic lacquer layer still present.

FIG. 1 shows a workpiece 10 with a mould cavity 12, the surface 14 of which is to be provided with an engraving. The surface 14 of the mould cavity is provided firstly with a photographic lacquer layer 16, which then subsequently constitutes an etching mask.

Above the workpiece 10, FIG. 1 shows in section a thin, flexible support foil 18, which carries a pattern 20 corresponding to the shape of the desired engraving and produced by a printing process, on which pattern an adhesive layer 22 is located. Since the conventional photographic lacquers must be illuminated with ultraviolet light, the dye used for pattern 20 will be one which is opaque to ultraviolet light, which is the case of the commercially available support foils, in which the pattern consists of a bituminous paint.

For transferring the pattern 20 to the photolacquer layer 16, the support foil and the layers carried by it are moistened and placed on the mould cavity surface 14.

Since the thin support foil 18 is flexible, it can be used to cover free of folds almost any curved surface. After drying of the adhesive layer 22, the support foil 18 is stripped off, whilst the pattern 20 remains on the photographic lacquer layer 16 owing to the adhesive layer 22.

Following this, the photographic lacquer layer 16 is exposed through the exposure mask formed by pattern 20 to ultraviolet light coming from a light coming from a light source 30, after which the printing dye of pattern 20 is removed with a suitable solvent. Subsequently, depending on the type of photographic lacquer used, the exposed or unexposed regions of the photographic lacquer layer are washed off together with the adhesive of layer 22, so that the remaining regions 32 of the photographic lacquer layer form an etching mask. During the subsequent treatment of the mould cavity surface 14 with an etching agent, there are then formed in the mould cavity surface recesses 36, which constitute the desired engraving. Lastly, the remainder of the photographic lacquer is washed off.

It is self-evident that the term "pattern" or "engraving" refers not only to a decorative effect, but also to other patterns, in particular also to letters, numerals, and the like.

I claim:

1. A method of engraving an arbitrarily curved or plane surface of a workpiece by etching, comprising applying a photographic lacquer layer to the surface of the workpiece to be etched, depositing on the photographic lacquer layer a thin flexible support foil which carries a dissolvable pattern made of a dye opaque to light with the pattern bearing side of the foil on the photographic lacquer layer, transferring the pattern to the photographic lacquer layer, first removing the support foil, then exposing the photograpic lacquer layer to light through the pattern, removing the exposed or unexposed regions of the photograhic lacquer layer, and treating the surface of the workpiece with an etching agent so that the regions not covered by the lacquer layer on the workpiece are subjected to etching.

2. A method as claimed in claim 1 in which between the support foil and the photographic lacquer layer a soluble adhesive layer is provided for fixing of the pattern on the layer of photographic lacquer.

3. A method as claimed in claims 1 or 2, in which after exposure the pattern is removed by means of a solvent of the dye composing the pattern.

* * * * *